United States Patent
Fujiwara (10) Patent No.: US 8,493,147 B2
(45) Date of Patent: Jul. 23, 2013

(54) DIFFERENTIAL AMPLIFIER AND SOURCE DRIVER

(75) Inventor: Hirofumi Fujiwara, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 67 days.

(21) Appl. No.: 12/929,893

(22) Filed: Feb. 23, 2011

(65) Prior Publication Data

US 2011/0227647 A1    Sep. 22, 2011

(30) Foreign Application Priority Data

Mar. 16, 2010    (JP) .................................. 2010-059458

(51) Int. Cl.
 *H03F 3/45*    (2006.01)
(52) U.S. Cl.
 USPC .......................................................... 330/253
(58) Field of Classification Search
 USPC ................................. 330/252–261
 See application file for complete search history.

(56) References Cited

U.S. PATENT DOCUMENTS 7,342,449 B2 *   3/2008   Ishii et al. ...................... 330/253
2006/0028274 A1   2/2006   Ishii et al.

FOREIGN PATENT DOCUMENTS

JP       2006-050296       2/2006

OTHER PUBLICATIONS

Notification of Reasons for Refusal dated Mar. 12, 2013 with English translation.

* cited by examiner

*Primary Examiner* — Robert Pascal
*Assistant Examiner* — Khiem Nguyen
(74) *Attorney, Agent, or Firm* — McGinn IP Law Group, PLLC (57) ABSTRACT

A differential amplifier includes a first differential pair with one of an input pair serving as a first input terminal, a second differential pair with one of an input pair serving as a second input terminal, connected in parallel with the first differential pair and having the same conductivity type as the first differential pair, and a first capacity reduction circuit that reduces a capacity of the first differential pair in operation when a first input voltage input to the first input terminal is equal to or higher than an operation threshold of the first differential pair and a second input voltage input to the second input terminal is lower than an operation threshold of the second differential pair.

12 Claims, 9 Drawing Sheets

DIFFERENTIAL AMPLIFIER AND SOURCE DRIVER

CROSS-REFERENCE TO RELATED APPLICATIONS

This application is based upon and claims the benefit of priority from Japanese patent application No. 2010-059458, filed on Mar. 16, 2010, the disclosure of which is incorporated herein in its entirety by reference.

BACKGROUND

The present invention relates to a differential amplifier and a source driver and, particularly, to a differential amplifier incorporated into a source driver that drives a liquid crystal display device and a source driver incorporating the same.

A source driver that drives a liquid crystal display device incorporates a differential amplifier as a source amplifier. The source driver first divides a γ(gamma) voltage applied externally by resistors to generate liquid crystal gray scale reference voltages and then selects a reference voltage by a D/A converter. The selected reference voltage is input to the source amplifier in a voltage follower configuration in order to reduce impedance and make fine adjustments of the reference voltage. An output of the source amplifier is connected to a source terminal of a liquid crystal panel, and a panel pixel capacitor is driven with the output from the source amplifier.

Recent liquid crystal display devices for use as TV or PC displays have a larger screen and higher definition. With such trends, the source driver is required to have a capability to drive a larger load at a higher speed and with a lower power. Particularly, an increase in gray-scale intensity is in progress for higher-definition color liquid crystals, and transition has been made from 260000 colors (6 bits per Red, Green and Blue) to 16.7 million colors (8 bits), and to 1 billion colors (10 bits).

With an increase in the number of bits, a gray-scale voltage input to the source driver increases like 64 gray scales with 6 bits, 256 gray scales with 8 bits, and 1024 gray scales with 10 bits. The increase in gray-scale voltage leads to a decrease in steps of the voltage input to the source driver. Therefore, improvement in output voltage accuracy is required in the source amplifier, and property specifications such as input-output offset, output deviation and amplitude difference deviation are becoming stricter.

Figure 4:
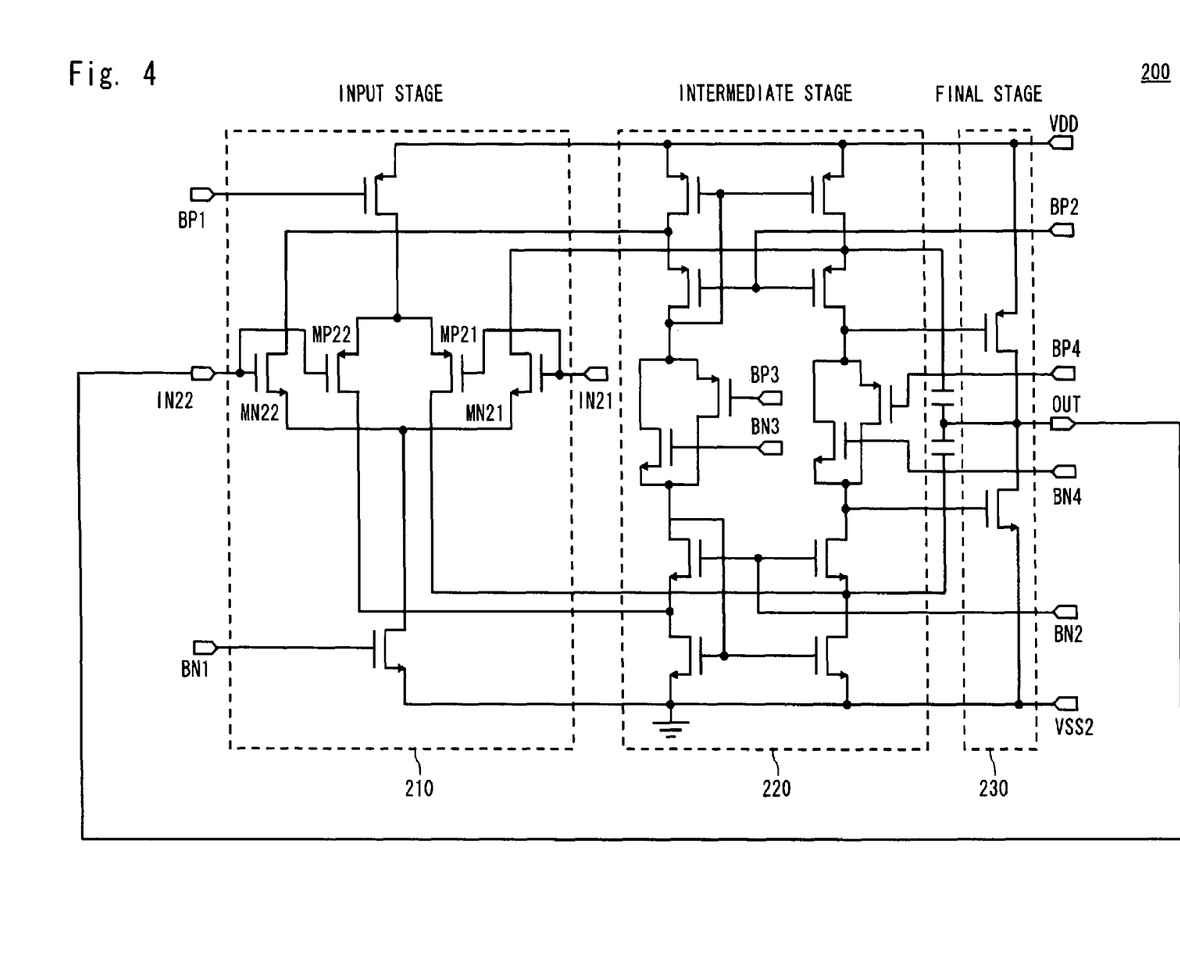
FIG. 4 is a circuit diagram showing a configuration of a differential amplifier 200 according to an embodiment.

FIG. 4 shows a typical circuit which is used as a source amplifier. A differential amplifier 200 shown in FIG. 4 is a so-called Rail-to-Rail amplifier. The differential amplifier 200 is broadly divided into an input stage 210, an intermediate stage 220, and a final stage 230.

Figure 5:
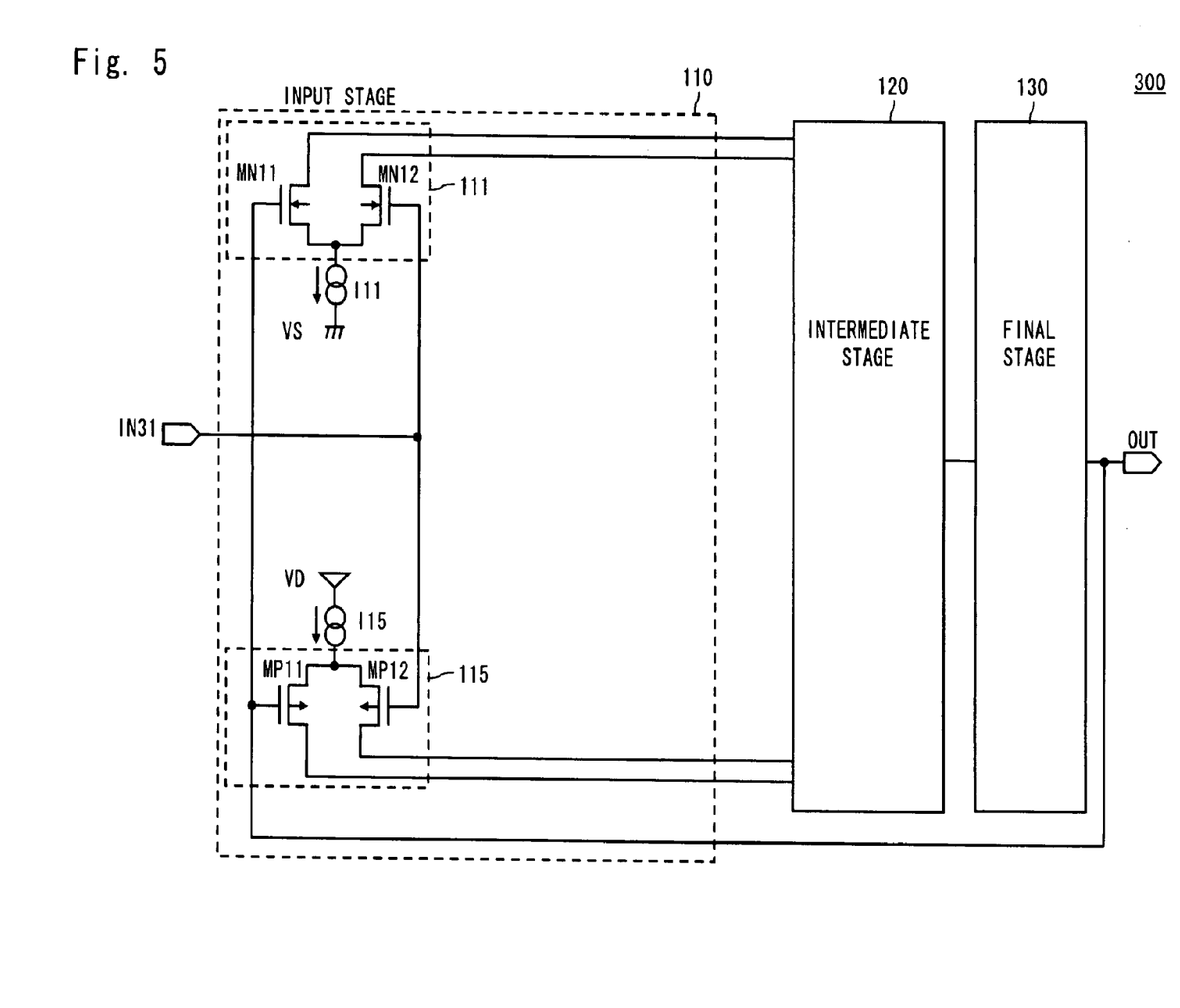
FIG. 5 is a circuit diagram showing a configuration of a differential amplifier 300 according to an embodiment.

FIG. 5 shows a simplified illustration of the differential amplifier 200 shown in FIG. 4. As shown in FIG. 5, a differential amplifier 300 is broadly divided into an input stage 110, an intermediate stage 120, and a final stage 130. The input stage 110 includes differential pairs of reverse conductivity types to each other in order to implement the Rail-to-Rail configuration. Specifically, the input stage 110 includes an Nch differential pair 111 composed of Nch MOS transistors (NchTr) MN11 and MN12 having sources connected in common to a constant current source I11, and a Pch differential pair 115 composed of Pch MOS transistors (PchTr) MP11 and MP12 having sources connected in common to a constant current source I15.

An input voltage range of the differential amplifier 300 is described hereinafter. It is assumed that the "+" power supply (higher power supply) of the source amplifier is VDD, and the "−" power supply (lower power supply) of the source amplifier is VSS. When an input voltage $V_{in31}$ input from an input terminal IN31 is as low as near the − power supply voltage VSS, the Pch MOS transistors MP11 and MP12 of the Pch differential pair 115 operate. When, on the other hand, the input voltage $V_{in31}$ is as high as near the + power supply voltage VDD, the Nch MOS transistors MN11 and MN12 of the Nch differential pair 111 operate. When the input voltage $V_{in31}$ is an intermediate voltage between those, both of the Pch MOS transistors MP11 and MP12 of the Pch differential pair 115 and the Nch MOS transistors MN11 and MN12 of the Nch differential pair 111 operate. Therefore, the source amplifier which uses the differential amplifier 300 can obtain the input stage 110 that operates in the input range of substantially all power supply voltages.

A voltage obtained by resistor-division of a gamma voltage is input to the source amplifier, and the voltage corresponding to a polarity signal POL having 64 gray scales (6 bits) to 256 gray scales (8 bits) for both positive and negative has become mainstream. As the number of bits increases, a difference in luminance between gray scales becomes less recognizable, thus rendering smooth high-quality pictures. However, as the number of bits increases, the D/A converter circuit that selects a voltage generated by the resistor division increases in size.

Figure 6:
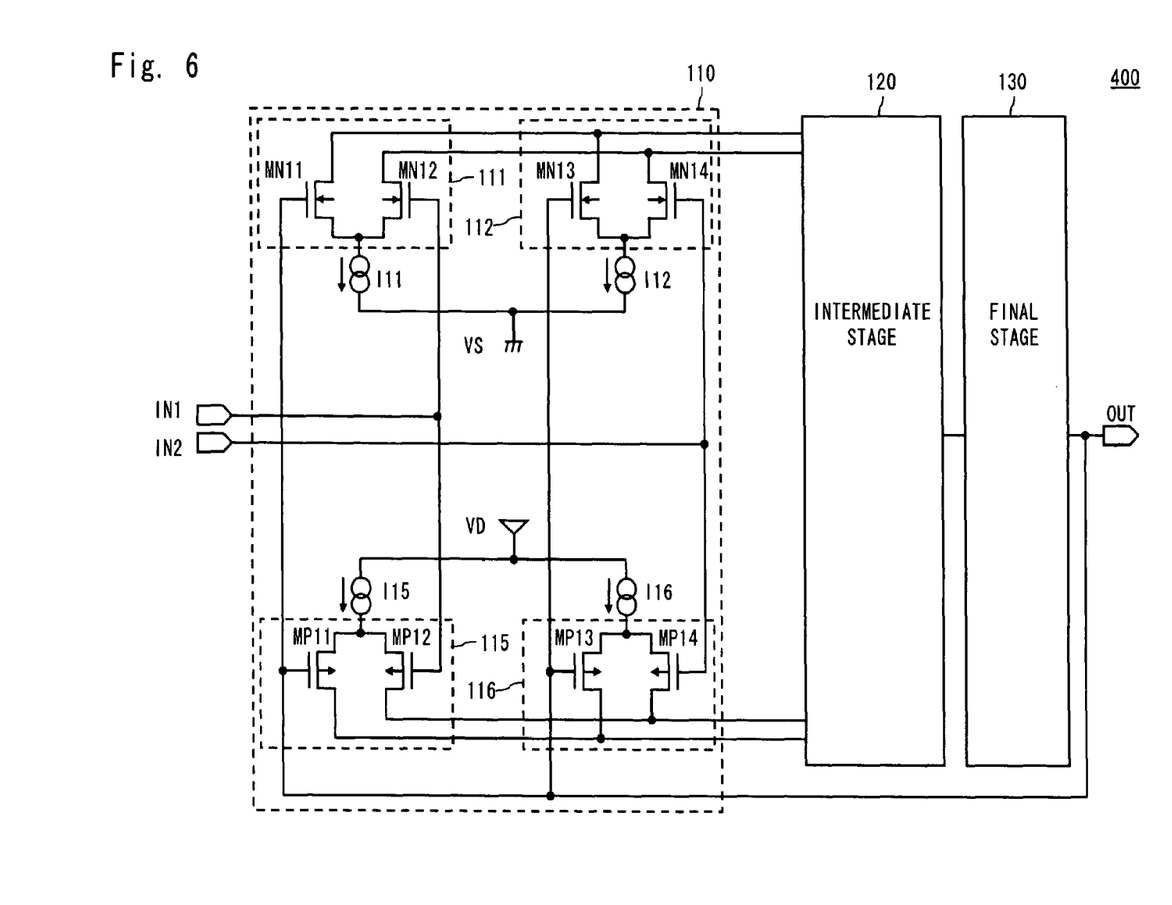
FIG. 6 is a circuit diagram showing a configuration of a differential amplifier 400 according to an embodiment.

To avoid this, products with a large number of bits adopts an interpolation function to the source amplifier. FIG. 6 shows a differential amplifier used for the source amplifier having the interpolation function. Referring to FIG. 6, a differential amplifier 400 has a configuration in which an Nch differential pair 112 composed of Nch MOS transistors MN13 and MN14 having sources connected in common to a constant current source I12, and a Pch differential pair 116 composed of Pch MOS transistors MP13 and MP14 having sources connected in common to a constant current source I14 are added to the differential amplifier 300 shown in FIG. 5.

The Nch MOS transistors MN13 and MN14 of the Nch differential pair 112 are connected in parallel with the Nch MOS transistors MN11 and MN12 of the Nch differential pair 111 with their drains connected in common. Likewise, the Pch MOS transistors MP13 and MP14 of the Pch differential pair 116 are connected in parallel with the Pch MOS transistors MP11 and MP12 of the Pch differential pair 115 with their drains connected in common. Further, an input terminal IN2 as an input to the Nch MOS transistor MN14 and the Pch MOS transistor MP14 is also added. Note that an input of the Nch MOS transistor MN12 and the Pch MOS transistor MP12 is the input terminal IN1.

The differential amplifier 400 has an interpolation function that interpolates a voltage which internally divides an input voltage $V_{in1}$ input to the input terminal IN1 and an input voltage $V_{in2}$ input to the input terminal IN2 with a ratio of 1:1. With the interpolation function, an output voltage $V_{out}$ of $(V_{in1}+V_{in2})/2$ can be output.

For example, when an output set voltage is V1, a voltage of V1+α(V) is input to the input terminal IN1, and a voltage of V1−α(V) is input to the input terminal IN2. Then, an intermediate voltage between the input terminals IN1 and IN2, which is V1, is output to the output terminal OUT. Further, when the output set voltage is V1+α(V), a voltage of V1+α(V) is input to both of the input terminals IN1 and IN2. Then, an intermediate voltage between the input terminals IN1 and IN2, which is V1+α(V), is output to the output terminal OUT. On the other hand, when the output set voltage is V1−α(V), a voltage of V1−α(V) is input to both of the input terminals IN1 and IN2. Then, an intermediate voltage between the input terminals IN1 and IN2, which is V1−α(V), is output to the output terminal OUT.

In this manner, in the differential amplifier 400, if there are two levels of input voltages, V1+α(V) and V1−α(V), three levels of output voltages $V_{out}$, V1+α(V), V1(V) and V1−α (V), can be output with use of the interpolation function. Specifically, the number of input gray-scale power supply lines can be reduced relative to the number of output gray scales. This eliminates the need to input V1(V) to the differential amplifier 400, which enables reduction of the circuit size of the D/A converter.

Figure 7:
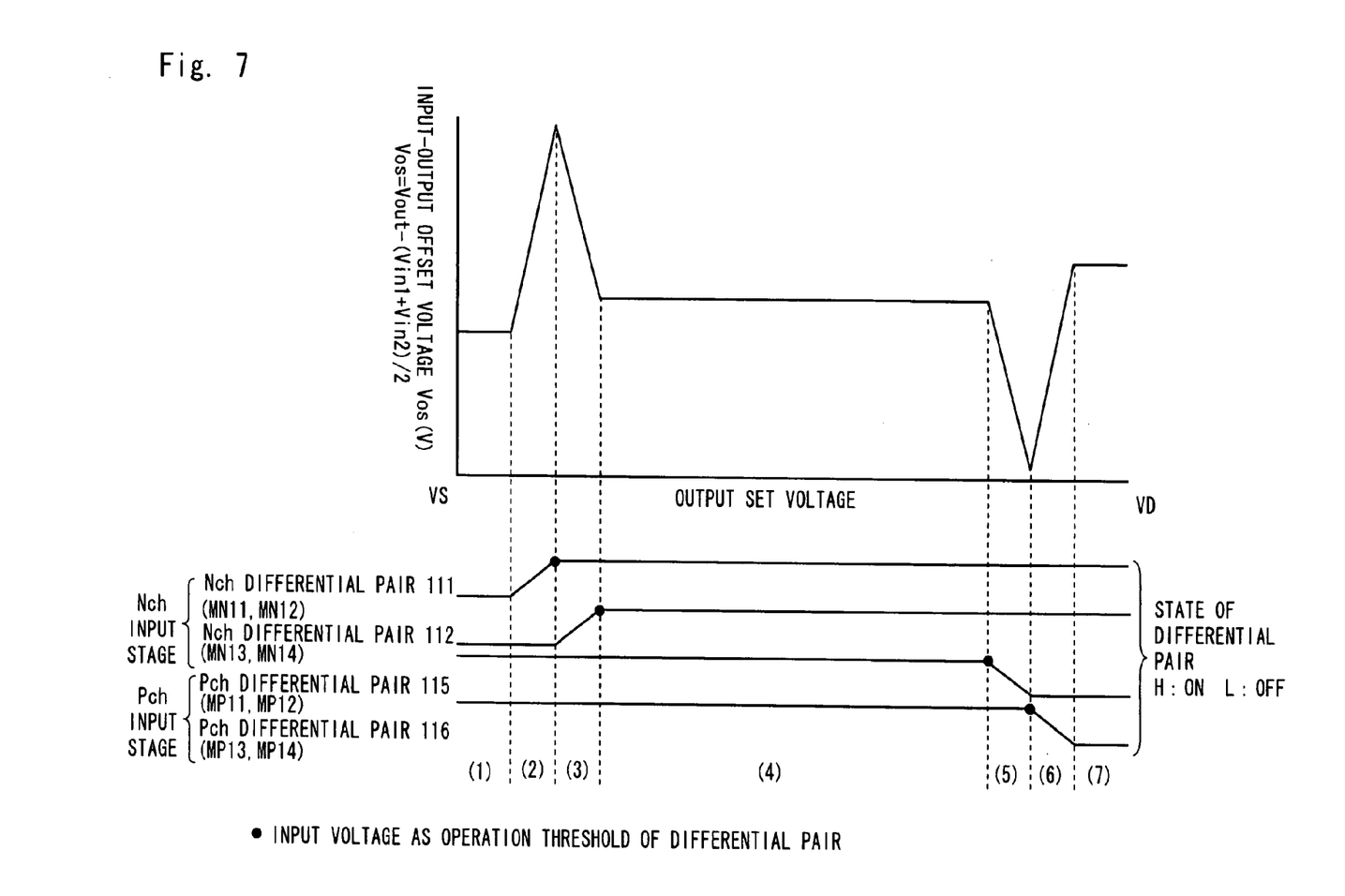
FIG. 7 is a graph showing an operation waveform of the differential amplifier 400 according to the embodiment.

However, the differential amplifier 400 has a drawback that, when the output set voltage (i.e. the input voltage) is a voltage near the − power supply voltage VSS or the + power supply voltage VDD, an offset between input and output is deteriorated. This is described hereinafter with reference to FIG. 7. In FIG. 7, the upper part shows an input-output offset voltage $V_{os}$ of the differential amplifier 400, and the lower part shows the respective states of the Nch differential pairs 111 and 112 and the Pch differential pairs 115 and 116. The horizontal axis indicates the output set voltage. Note that the input voltages have the relationship of $V_{in1} > V_{in2}$, and the input-output offset voltage $V_{os}$ is $V_{out} - (V_{in1} + V_{in2})/2$.

An input voltage that allows the Nch input stage to operate is equal to or higher than VT(MN11~14)+VDS(I11,I12), which is an operation threshold of the Nch differential pairs 111 and 112. On the other hand, an input voltage that allows the Pch input stage to operate is equal to or higher than VT(MP11~14)+VDS(I15,I16), which is an operation threshold of the Pch differential pairs 115 and 116. Note that, in this specification, the operation threshold of the Pch differential pairs 115 and 116 is described from the aspect of being a voltage difference from the + power supply voltage VDD, not the absolute value of an input voltage. Specifically, in the Pch differential pairs 115 and 116, "equal to or higher than the operation threshold" means that a potential difference between an input voltage and the + power supply voltage VDD is large, and "equal to or lower than the operation threshold" means that a potential difference between an input voltage and the + power supply voltage VDD is small.

Therefore, referring to FIG. 7, both of the Nch input stage and the Pch input stage operate in the voltage range (4) which is equal to or higher than the operation threshold of the Nch differential pairs 111 and 112 and equal to or higher than the operation threshold of the Pch differential pairs 115 and 116.

On the other hand, in the voltage range (3) which is equal to or lower than the operation threshold of the Nch differential pair 112, the Nch differential pair 112 operates with the threshold or lower, and the Nch differential pair 111 and the Pch input stage operate. Further, in the voltage range (2) which is equal to or lower than the operation threshold of the Nch differential pair 111, only the Nch differential pair 112 is completely off, the Nch differential pair 111 operates with the threshold or lower, and the Pch input stage operates. In the voltage range (1) where the Nch input stage is completely off, only the Pch input stage operates.

Likewise, in the voltage range (5) which is equal to or lower than the operation threshold of the Pch differential pair 115, the Pch differential pair 115 operates with the threshold or lower, and the Pch differential pair 116 and the Nch input stage operate. Further, in the voltage range (6) which is equal to or lower than the operation threshold of the Pch differential pair 116, only the Pch differential pair 115 is completely off, the Pch differential pair 116 operates with the threshold or lower, and the Nch input stage operates. In the voltage range (7) where the Pch input stage is completely off, only the Nch input stage operates.

As is obvious from FIG. 7, in the differential amplifier 400, an input-output offset is deteriorated in the voltage ranges (2), (3), (5) and (7). In this manner, in the differential amplifier 400, use of the interpolation function in the state where a voltage of lower than the operation threshold of the differential pair constituting the input stage 110 is input to one of the input terminals IN1 and IN2 causes degradation of an input-output offset. This means that highly accurate interpolation cannot be performed in the gray-scale which corresponds to the voltage range were an input-output offset is degraded.

The mechanism which causes degradation of an input-output offset in the differential amplifier 400 is described hereinafter, using a case where the output set voltage is V1, and the output set voltage V1 is near the − power supply voltage VSS as an example.

V1+α(V) is input as the input voltage $V_{in1}$ to the input terminal IN1, and V1−α(V) is input as the input voltage $V_{in2}$ to the input terminal IN2. In this case, it is ideal that an intermediate voltage between the input terminals IN1 and IN2, which is V1, is output as an output voltage $V_{out}$ to the output terminal OUT.

Assume that the operation threshold of the Nch input stage is V1. The MN11 and MN12 of the Nch differential pair 111 operate because the input voltage $V_{in}$ to the input terminal IN1 is equal to or higher than the operation threshold. However, the MN13 and MN14 of the Nch differential pair 112 are in the operating state with the operation threshold or lower because the input voltage $V_{in2}$ to the input terminal IN2 is lower than the operation threshold.

In other words, although the Pch input stage performs a negative feedback operation so as to converge on V1 as ideal, the Nch input stage performs a negative feedback operation so that an output converges on V1+α(V) because only the Nch differential pair 111 is operating. Consequently, a difference in convergence voltage arises between the Pch input stage and the Nch input stage, and the output voltage $V_{out}$ has an offset in the "+" direction, which is the same as +α(V) as a result.

As described above, when outputting a voltage near the − power supply voltage, two Nch differential pairs 111 and 112 stop operating one by one as the input voltages $V_{in1}$ and $V_{in2}$ get lower, and, in its process, a case arises where one operates in the non-saturation region and the other operates in the saturation region. Likewise, when outputting a voltage near the + power supply voltage, two Pch differential pairs 115 and 116 stop operating one by one as the input voltages $V_{1n1}$ and $V_{in2}$ get higher, and, in its process, a case arises where one operates in the non-saturation region and the other operates in the saturation region. Then, when one operates in the non-saturation region and the other operates in the saturation region, a difference in convergence voltage arises between the Pch input stage and the Nch input stage, which causes degradation in input-output offset.

Figure 8:
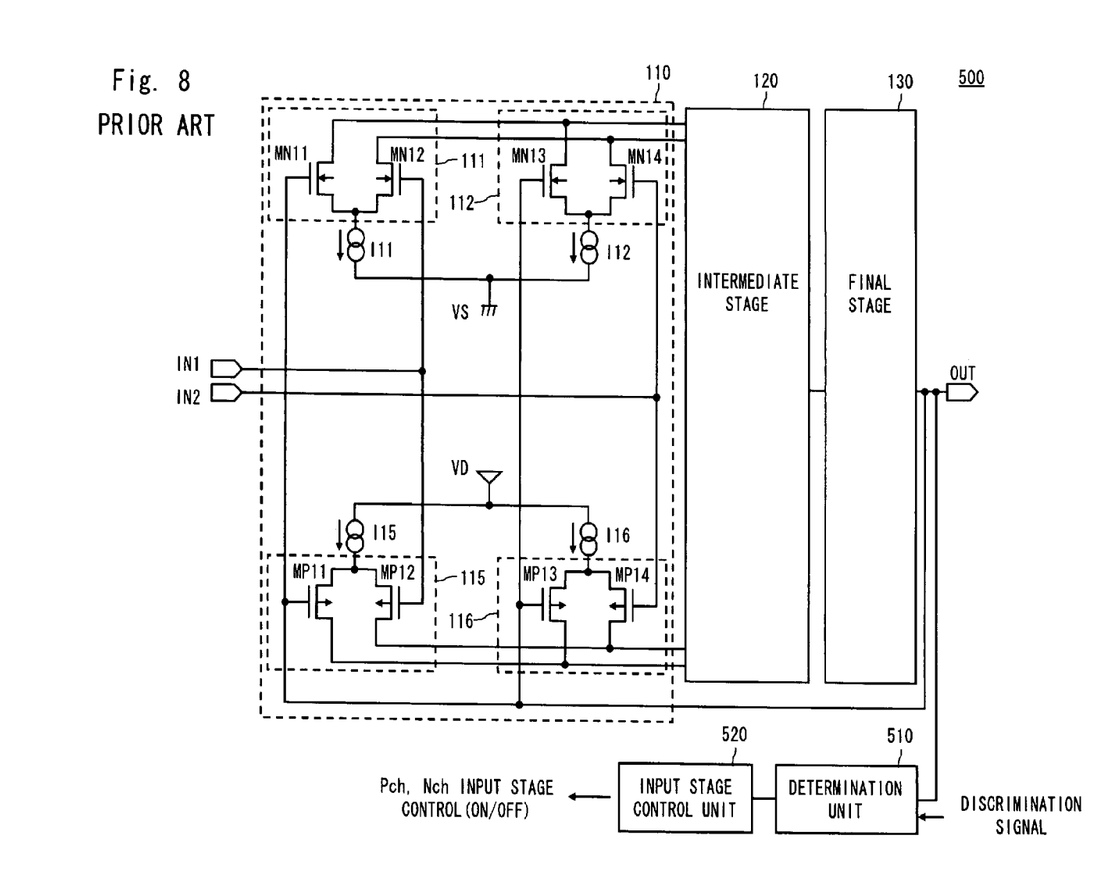
FIG. 8 is a circuit diagram showing a configuration of a differential amplifier 500 according to prior art.

A technique to address such an issue is disclosed in Japanese Unexamined Patent Application Publication No. 2006-50296. FIG. 8 is a circuit diagram showing a configuration of a differential amplifier 500 disclosed in Japanese Unexamined Patent Application Publication No. 2006-50296. Referring to FIG. 8, the differential amplifier 500 has a configuration in which a determination unit 510 that compares levels of the output voltage $V_{out}$ and a discrimination signal, and an input stage control unit 520 that controls the input stage 110 are added to the differential amplifier 400 shown in FIG. 6. When the differential amplifier 500 outputs a voltage near the − power supply voltage VSS or the +power supply voltage VDD, it turns off the Nch input stage or the Pch input stage depending on the output voltage $V_{out}$ and the discrimination signal before degradation in offset occurs.

Figure 9:
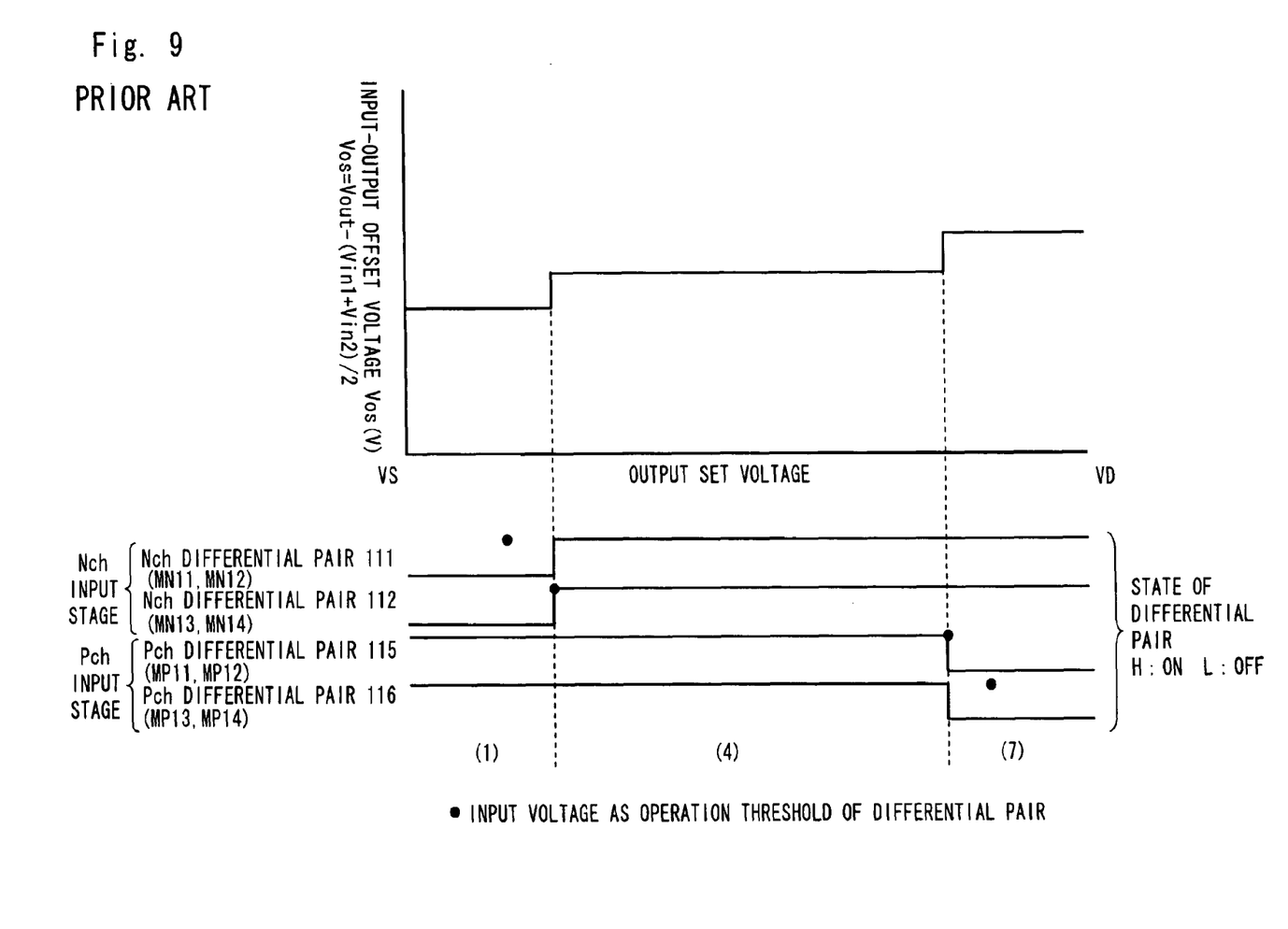
FIG. 9 is a graph showing an operation waveform of the differential amplifier 500 according to the prior art.

FIG. 9 is a graph showing an operation waveform of the differential amplifier 500. The upper part of FIG. 9 shows an input-output offset voltage $V_{os}$ of the differential amplifier 500, and the lower part shows the respective states of the Nch differential pairs 111 and 112 and the Pch differential pairs 115 and 116. The horizontal axis indicates the output set voltage. Note that the input voltages have the relationship of $V_{in1} > V_{in2}$, and the input-output offset voltage $V_{os}$ is $V_{out} - (V_{in1} + V_{in2})/2$.

As shown in FIG. 9, when the input voltage is a voltage near the − power supply voltage VSS, the Nch input stage is turned completely off by the input stage control unit 520, and only the Pch input stage operates (voltage range (1)). Therefore, an offset of the Pch input stage appears in the output voltage \V$_{out}$ from the output terminal OUT. Further, when the input voltage is an intermediate voltage, the Nch input stage and the Pch input stage are both on (voltage range (4)). Therefore, offsets of the Nch input stage and the Pch input stage appear in the output voltage \V$_{out}$. On the other hand, when the input voltage is a voltage near the + power supply voltage VDD, the Pch input stage is turned completely off by the input stage control unit 520, and only the Nch input stage operates (voltage range (7)). Therefore, an offset of the Nch input stage appears in the output voltage $V_{out}$.

SUMMARY

In this manner, in the differential amplifier 500, the above-described three states are constructed by the operation of the input stage control unit 520. As a result, an abrupt change occurs in input-output offset, which leads to degradation in linearity between input and output.

A first aspect of the present invention is a differential amplifier which includes a first differential pair with one of an input pair serving as a first input terminal, a second differential pair with one of an input pair serving as a second input terminal, the second differential pair connected in parallel with the first differential pair and having the same conductivity type as the first differential pair, and a first capacity reduction circuit that reduces a capacity of the first differential pair in operation when a first input voltage input to the first input terminal is equal to or higher than an operation threshold of the first differential pair and a second input voltage input to the second input terminal is lower than an operation threshold of the second differential pair. It is thereby possible to suppress a negative feedback operation which converges on the first input voltage or the second input voltage when an output set voltage is near a power supply voltage.

A second aspect of the present invention is a differential amplifier which includes a first differential pair with one of an input pair serving as a first input terminal, a second differential pair with one of an input pair serving as a second input terminal, the second differential pair connected in parallel with the first differential pair and having the same conductivity type as the first differential pair, and a transistor with a source and a drain connected in series between constant current sources of the first and second differential pairs and a power supply that supplies a power in common to the constant current sources of the first and second differential pairs, and a gate connected to one of the first input terminal and the second input terminal, the transistor having the same conductivity type as the first differential pair. It is thereby possible to suppress a negative feedback operation which converges on the first input voltage or the second input voltage when an output set voltage is near a power supply voltage.

According to the aspects of the present invention described above, it is possible to provide a differential amplifier and a source driver capable of improving linearity of an input-output offset near a power supply voltage.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Exemplary embodiments of the present invention will be explained hereinbelow with reference to the drawings. The following description and the attached drawings are appropriately shortened and simplified as appropriate to clarify the explanation. Further, the redundant explanation is omitted as appropriate to clarify the explanation. In the figures, the identical reference symbols denote identical structural elements and the redundant explanation thereof is omitted as appropriate.

Figure 1:
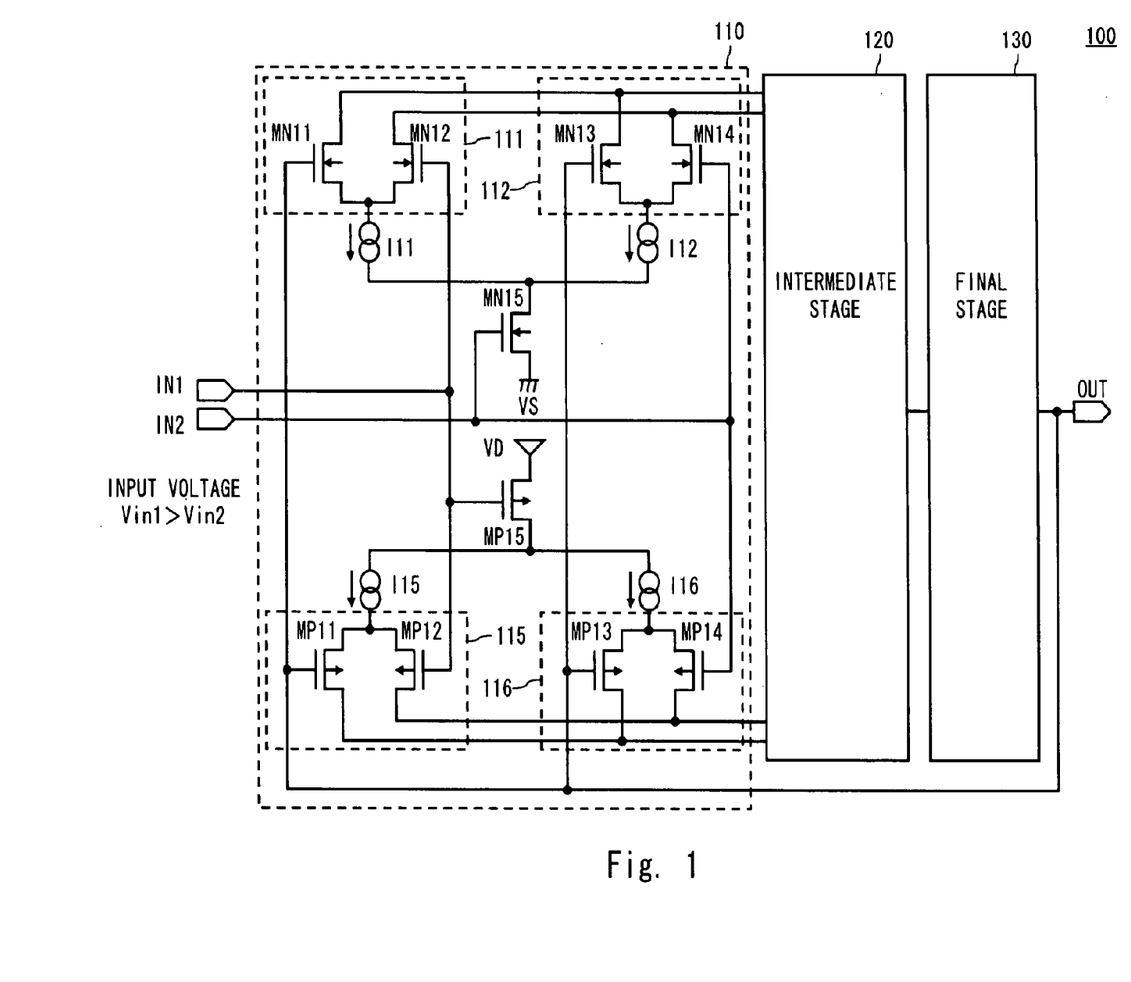
FIG. 1 is a circuit diagram showing a configuration of a differential amplifier 100 according to an embodiment.

A configuration of a differential amplifier according to an embodiment is described firstly with reference to FIG. 1. FIG. 1 is a circuit diagram showing a configuration of a differential amplifier 100 according to the embodiment. The differential amplifier 100 is incorporated into a source driver for a display device, which drives a display device such as a liquid crystal display device.

Referring to FIG. 1, the differential amplifier 100 according to the embodiment has a configuration in which an Nch MOS transistor MN15 connected between constant current sources I11 and I12 and the − power supply VSS, and a Pch MOS transistor MP15 connected between the +power supply VDD and constant current sources I15 and I16 are added to the differential amplifier 400 shown in FIG. 6. The differential amplifier 100 is described in further detail hereinbelow.

As shown in FIG. 1, the differential amplifier 100 is broadly divided into an input stage 110, an intermediate stage 120, and a final stage 130. The input stage 110 includes at least two Nch differential pairs 111 and 112 and at least two Pch differential pairs 115 and 116.

The Nch differential pair 111 is composed of a pair of Nch MOS transistors MN11 and MN12 having sources connected in common. The commonly connected sources of the Nch MOS transistors MN11 and MN12 are connected to the constant current source I11. Likewise, the Nch differential pair 112 is composed of a pair of Nch MOS transistors MN13 and MN14 having sources connected in common. The commonly connected sources of the Nch MOS transistors MN13 and MN14 are connected to the constant current source I12.

The drains of the Nch MOS transistors MN11 and MN13 are connected in common to the intermediate stage 120. Further, the drains of the Nch MOS transistors MN12 and MN14 are connected in common to the intermediate stage 120. Specifically, the Nch MOS transistors MN11 and MN12 of the Nch differential pair 111 are connected in parallel with the Nch MOS transistors MN13 and MN14 of the Nch differential pair 112 with their drains connected in common.

On the other hand, the Pch differential pair 115 is composed of a pair of Pch MOS transistors MP11 and MP12 having sources connected in common. The commonly connected sources of the Pch MOS transistors MP11 and MP12 are connected to the constant current source I15. Likewise, the Pch differential pair 116 is composed of a pair of Pch MOS transistors MP13 and MP14 having sources connected in common. The commonly connected sources of the Pch MOS transistors MP13 and MP14 are connected to the constant current source I14.

The drains of the Pch MOS transistors MP11 and MP13 are connected in common to the intermediate stage 120. Further, the drains of the Pch MOS transistors MP12 and MP14 are connected in common to the intermediate stage 120. Specifically, the Pch MOS transistors MP11 and MP12 of the Pch differential pair 115 are connected in parallel with the Pch MOS transistors MP13 and MP14 of the Pch differential pair 116 with their drains connected in common.

The gate of the Nch MOS transistors MN12 and the gate of the Pch MOS transistors MP12 are connected in common to an input terminal IN1. The gate of the Nch MOS transistors MN14 and the gate of the Pch MOS transistors MP14 are connected in common to an input terminal IN2. The gates of the Nch MOS transistors MN11 and MN13 and the gates of the Pch MOS transistors MP11 and MP13 are connected to an output terminal OUT. Thus, in the Nch differential pair 111 and the Pch differential pair 115, one of the input pair serves as the input terminal IN1. Further, in the Nch differential pair 112 and the Pch differential pair 116, one of the input pair serves as the input terminal IN2.

The input stage 110 further includes the Nch MOS transistor MN15 and the Pch MOS transistor MP15. The Nch MOS transistor MN15 is connected between the constant current sources I11 and I12 and the − power supply VSS. The source of the Nch MOS transistor MN15 is connected to the − power supply VSS, and the drain thereof is connected to the constant current sources I11 and I12. The source and the drain of the Nch MOS transistor MN15 are connected in series between the respective constant current sources I11 and I12 of the Nch differential pairs 111 and 112 and the − power supply VSS that supplies a power in common to the constant current sources I11 and I12. On the other hand, the Pch MOS transistor MP15 is connected between the constant current sources I15 and I16 and the +power supply VDD. The source of the Pch MOS transistor MP15 is connected to the + power supply VDD, and the drain thereof is connected to the constant current sources I15 and I16. The source and the drain of the Pch MOS transistor MP15 are connected in series between the respective constant current sources I15 and I16 of the Pch differential pair 115 and 116 and the + power supply VDD that supplies a power in common to the constant current sources I15 and I16.

The differential amplifier 100 has an interpolation function that interpolates a voltage which internally divides an input voltage $V_{in1}$ input to the input terminal IN1 and an input voltage $V_{in2}$ input to the input terminal IN2 with a ratio of 1:1. With the interpolation function, an output voltage $V_{out}$ of $(V_{in1}+V_{in2})/2$ can be output.

Assume that the input voltages $V_{in1}$ and $V_{in2}$ respectively input to the input terminals IN1 and IN2 when using the interpolation function have the relationship of $V_{in1}>V_{in2}$. In this case, the gate of the Nch MOS transistor MN15 is connected to the input terminal IN2, and the gate of the Pch MOS transistor MP15 is connected to the input terminal IN1. The Nch MOS transistor MN15 and the Pch MOS transistor MP15 have a low W/L ratio and are used as an analog switch.

In this embodiment, the Nch MOS transistor MN15 is preset to begin to turn off when a voltage equal to or lower than the operation threshold of the Nch input stage (Nch MOS transistors MN11 to MN14) is input to the gate. In this example, when the input voltage $V_{in2}$ from the input terminal IN2 becomes equal to or lower than the operation threshold of the Nch differential pair 112, the Nch MOS transistor MN15 begins to turn off.

As described in detail later, by such a behavior of the Nch MOS transistor MN15, when the output set voltage is equal to or higher than the operation threshold of the Nch differential pair 111 and lower than the operation threshold of the Nch differential pair 112, the capacity of the Nch differential pair 111 in operation can be suppressed. Specifically, the Nch MOS transistor MN15 functions as a capacity reduction circuit that reduces the capacity of the Nch differential pair 111 in operation when the input voltage $V_{in1}$ to the input terminal IN1 is equal to or higher than the operation threshold of the Nch differential pair 111 and the input voltage $V_{in2}$ to the input terminal IN2 is lower than the operation threshold of the Nch differential pair 112.

Further, the Pch MOS transistor MP15 is preset to begin to turn off when a voltage equal to or lower than the operation threshold of the Pch input stage (Pch MOS transistors MP11 to MP14) is input to the gate. In this example, when the input voltage $V_{in1}$, from the input terminal IN1 becomes equal to or lower than the operation threshold of the Pch input stage, the Pch MOS transistor MP15 begins to turn off.

As described in detail later, by such a behavior of the Pch MOS transistor MP15, when the output set voltage is equal to or higher than the operation threshold of the Pch differential pair 116 and lower than the operation threshold of the Pch differential pair 115, the capacity of the Pch differential pair 116 in operation can be suppressed. Specifically, the Pch MOS transistor MP15 functions as a capacity reduction circuit that reduces the capacity of the Pch differential pair 116 in operation when the input voltage $V_{in2}$ to the input terminal IN2 is equal to or higher than the operation threshold of the Pch differential pair 116 and the input voltage $V_{in1}$ to the input terminal IN1 is lower than the operation threshold of the Pch differential pair 115.

Figure 2:
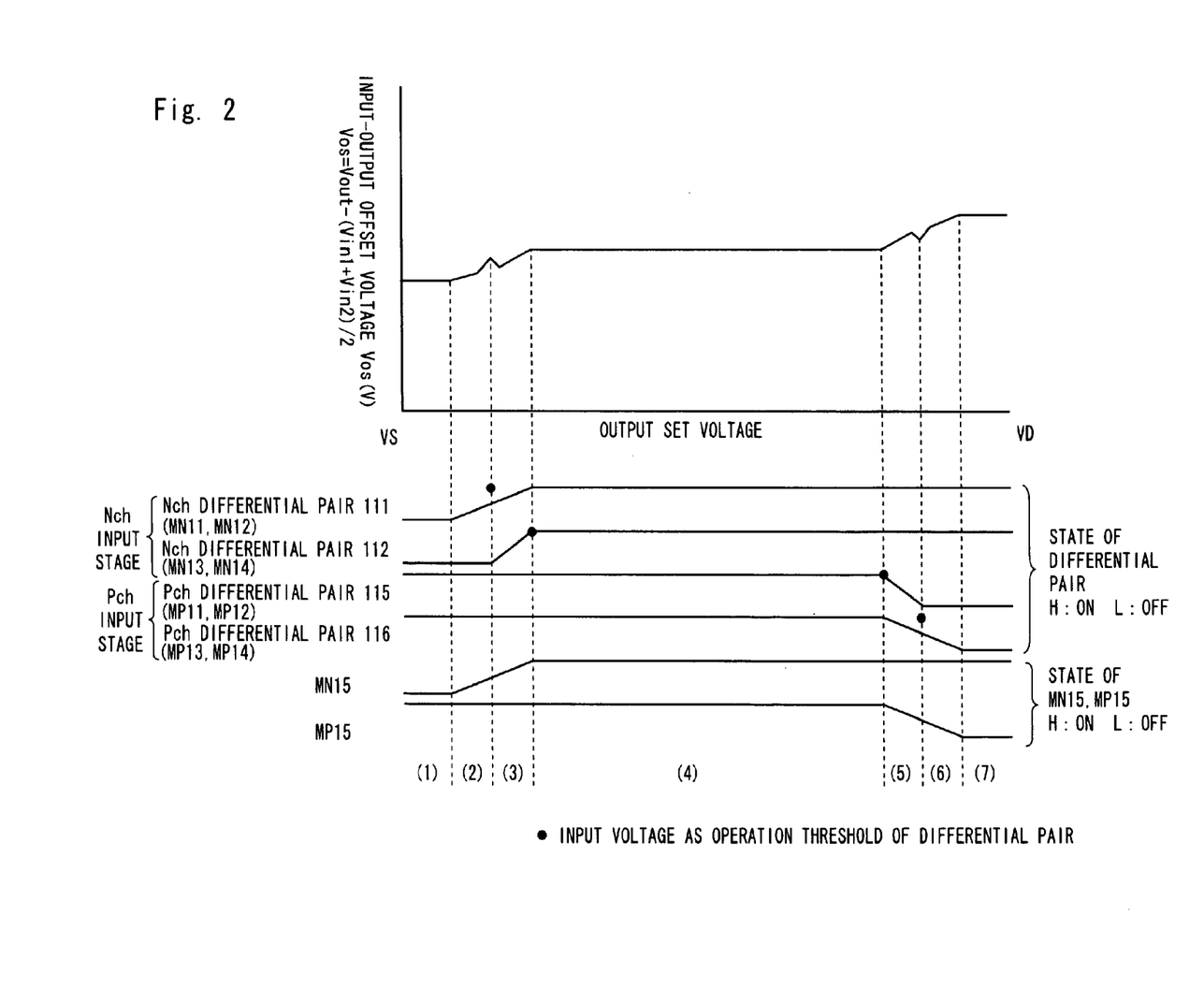
FIG. 2 is a graph showing an operation waveform of the differential amplifier 100 according to the embodiment.

The operation of the differential amplifier 100 having the above-described configuration is described hereinafter with reference to FIG. 2. FIG. 2 is a graph showing an operation waveform of the differential amplifier 100 according to the embodiment. In FIG. 2, the upper part shows an input-output offset voltage $V_{os}$ of the differential amplifier 100, and the lower part shows the respective states of the Nch differential pairs 111 and 112, the Pch differential pairs 115 and 116, the Nch MOS transistor MN15, and the Pch MOS transistor MP15. The horizontal axis indicates the output set voltage. Note that, when the output set voltage is V1(V), the input voltage $V_{in1}$ input to the input terminal IN1 is V1+α(V), and the input voltage $V_{in2}$ input to the input terminal IN2 is V1−α (V). Thus, the input voltage $V_{in1}$ and the input voltage $V_{in2}$ have the relationship of $V_{in1} > V_{in2}$. The input-output offset voltage $V_{os}$ is $V_{out} - (V_{in1} + V_{in2})/2$.

In FIG. 2, in the voltage range (1) where the input voltage $V_{in2}$ input to the input terminal IN2 is substantially the same as the − power supply voltage VSS, the Nch differential pairs 111 and 112 and the Nch MOS transistor MN15 are completely off, and only the Pch input stage is operating. Because the differential amplifier 100 operates only with the Pch input stage, an offset of the Pch input stage appears in the output voltage $V_{out}$ from the output terminal OUT.

When the input voltage $V_{in2}$ is at a level in the voltage range (2), the Nch MOS transistor MN15 and the Nch differential pair 111 are both in the state of operating with the operation threshold or lower. Only the Nch differential pair 112 is completely off, and the Pch input stage is operating. Because the Nch MOS transistor MN15 is on with a high resistance, the current of the constant current source I11 is suppressed, and the capacity (Gm) of the Nch differential pair 111 is thereby suppressed. Accordingly, the operation waveform of the Nch differential pair 111 is lower than that of the differential amplifier 400 shown in FIG. 7. Therefore, input-output offsets of the Pch input stage and the Nch differential pair 111 with a reduced capacity appear in the output voltage $V_{out}$.

When the output set voltage is in the voltage range (3), the Nch MOS transistor MN15 and the Nch differential pairs 111 and 112 are both in the state of operating with the operation threshold or lower. The Pch input stage is operating. Because the Nch MOS transistor MN15 is on with a high resistance, the currents of the constant current sources I11 and I12 are suppressed, and the capacities (Gm) of the Nch differential pairs 111 and 112 are thereby suppressed. Accordingly, the operation waveform of the Nch differential pair 111 is lower than that of the differential amplifier 400 shown in FIG. 7 and does not reach H. The operation waveform is thus as if it is in the non-saturation region. Therefore, input-output offsets of the Pch input stage and the Nch differential pairs 111 and 112 with a reduced capacity appear in the output voltage $V_{out}$.

When the output set voltage is in the voltage range (4), the Nch MOS transistor MN15 and the Nch differential pairs 111 and 112 are all in the state of operating with the operation threshold or higher. The Pch input stage is also operating with the operation threshold or higher. Because the Nch MOS transistor MN15 is completely on, the currents of the constant current sources I11 and I12 are not suppressed, and the capacities (Gm) of the Nch differential pairs 111 and 112 are also not suppressed. At this time, input-output offsets of the Pch input stage and the Nch input stage appear in the output voltage $V_{out}$.

When the output set voltage is in the voltage range (5), the Pch MOS transistor MP15 and the Pch differential pairs 115 and 116 are both in the state of operating with the operation threshold or lower. The Nch input stage is operating. Because the Pch MOS transistor MP15 is on with a high resistance, the currents of the constant current sources I15 and I16 are suppressed, and the capacities (Gm) of the Pch differential pairs 115 and 116 are thereby suppressed. Accordingly, the operation waveform of the Pch differential pair 116 is lower than that of the differential amplifier 400 shown in FIG. 7 and does not reach H. The operation waveform is thus as if it is in the non-saturation region. Therefore, input-output offsets of the Nch input stage and the Pch differential pairs 115 and 116 with a reduced capacity appear in the output voltage $V_{out}$.

When the input voltage $V_{in1}$ is at a level in the voltage range (6), the Pch MOS transistor MP15 and the Pch differential pair 116 are both in the state of operating with the operation threshold or lower. Only the Pch differential pair 115 is completely off, and the Nch input stage is operating. Because the Pch differential pair 115 is on with a high resistance, the current of the constant current source I14 is suppressed, and the capacity (Gm) of the Pch differential pair 116 is thereby suppressed. Accordingly, the operation waveform of the Pch differential pair 116 is lower than that of the differential amplifier 400 shown in FIG. 7. Therefore, input-output offsets of the Nch input stage and the Pch differential pair 116 with a reduced capacity appear in the output voltage $V_{out}$.

In the voltage range (7) where the input voltage $V_{in1}$ is substantially the same as the + power supply voltage VDD, the Pch differential pairs 115 and 116 and the Pch MOS transistor MP15 are both completely off, and only the Nch input stage is operating. Because the differential amplifier 100 operates only with the Nch input stage, an offset of the Nch input stage appears in the output voltage V.

As described above, in the differential amplifier 100 according to the embodiment, the Nch MOS transistor MN15 and the Pch MOS transistor MP15 suppress the currents of the constant current sources I11, I12, I15 and I16 in the voltage regions (2), (3), (5) and (6) where an input-output offset is deteriorated due to interpolation in the differential amplifier 400, thereby suppressing the capacity (Gm) of each differential pair of the input stage 110. This suppresses the negative feedback operation which converges on $V1+\alpha(V)$ when the output set voltage is near the − power supply voltage VSS, and suppresses the negative feedback operation which converges on $V1-\alpha(V)$ when the output set voltage is near the + power supply voltage VDD. It is thereby possible to maintain linearity between input and output.

Figure 3:
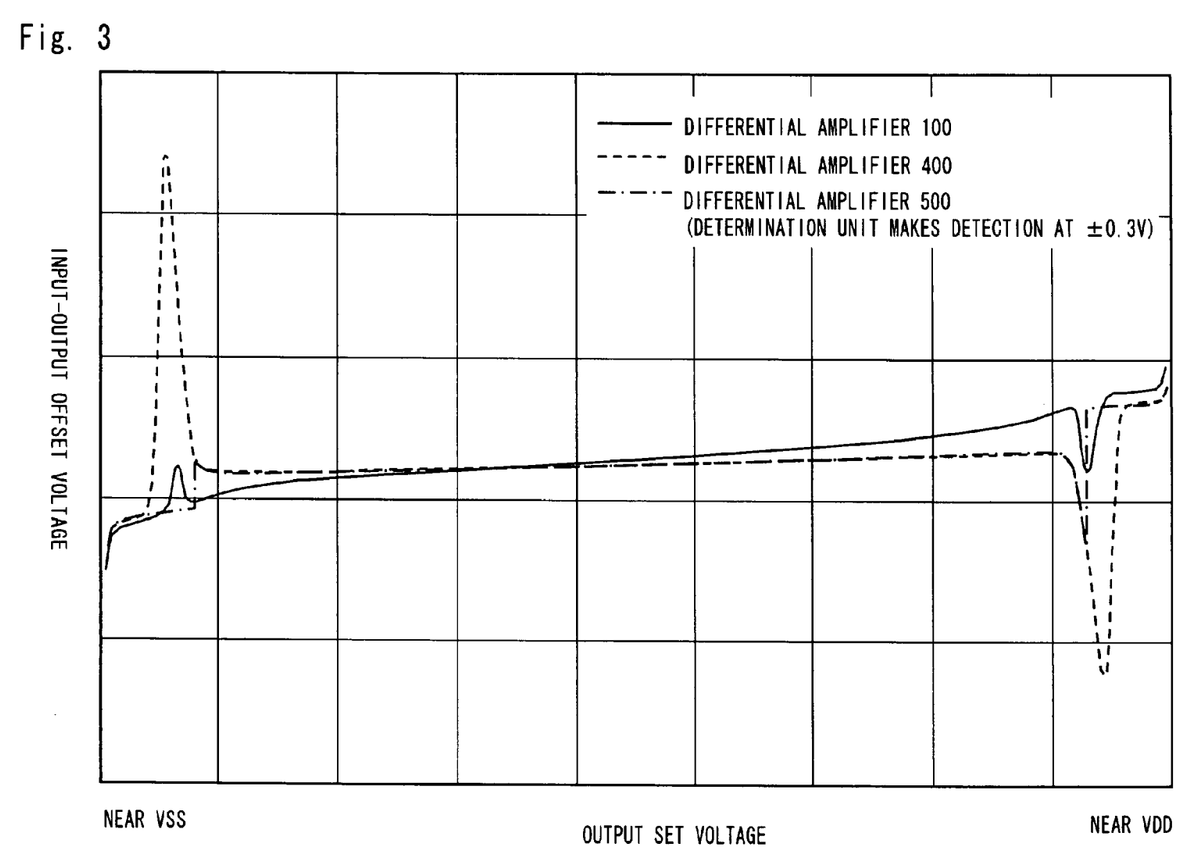
FIG. 3 is a simulation waveform showing an input-output offset voltage of the differential amplifier 100 according to the embodiment in comparison with that of differential amplifiers 400 and 500.

FIG. 3 is a simulation waveform showing an input-output offset voltage of the differential amplifier 100 according to the embodiment in comparison with that of differential amplifiers 400 and 500. In FIG. 3, the horizontal axis indicates an output set voltage (i.e. input voltage), and the vertical axis indicates an input-output offset.

In FIG. 3, at the output set voltage near the − power supply voltage VSS and the + power supply voltage VDD where the input-output offset is deteriorated in the differential amplifier 400, an abrupt change in input-output offset is observed in the differential amplifier 500. On the other hand, in the differential amplifier 100 according to the embodiment, linearity is achieved and a suitable result is obtained at the output set voltage near the − power supply voltage VSS and the + power supply voltage VDD where the input-output offset is deteriorated in the differential amplifier 400.

This is because, the differential amplifier 100 according to the embodiment has a configuration in which, at the output set voltage where an input voltage input to one of two differential pairs of the same conductivity type connected in parallel for the interpolation function is equal to or higher than the operation threshold and an input voltage input to the other one is lower than the operation threshold, the capacity of the differential pair in operation is reduced, not turned completely off as in the differential amplifier 500, as described above.

As described above, in this embodiment, a capacity reduction circuit is provided that reduces the capacity of the differential pair in operation when the output set voltage is such that an input voltage input to one of two differential pairs of the same conductivity type connected in parallel for the interpolation function is equal to or higher than the operation threshold and an input voltage input to the other one is lower than the operation threshold. The capacity reduction circuit suppresses the current of the constant current sources connected in common to the sources of one pair of MOS transistors constituting the differential pair in operation. This suppresses the negative feedback operation which converges on either one of the input voltages input to the differential pair when the output set voltage is near the power supply voltage. It is thereby possible to improve linearity of the input-output offset near the power supply voltage. Accordingly, it is possible to improve output deviation and amplitude difference deviation.

The present invention is not limited to the above-described embodiment, and various changes and modifications may be made without departing from the scope of the invention. For example, although two differential pairs of the same conductivity type are provided in the input stage 110 in the above embodiment by way of illustration, the number of differential pairs is not limited to two. Specifically, the number of differential pairs of the same conductivity type which are provided in the input stage 110 may be two or more, and the present invention is applicable to a differential amplifier in which at least two differential pairs of the same conductivity type are connected in parallel. Further, although the MOS transistor that acts as an analog switch is provided between the constant current sources and the power supply as the capacity reduction circuit that reduces the capacity of the differential pair in operation, another element may be used as long as it is capable of reducing the capacity of the differential pair in operation.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiment described above.

Furthermore, it is noted that, Applicant's intent is to encompass equivalents of all claim elements, even if amended later during prosecution.

What is claimed is:

1. A differential amplifier comprising:
a first differential pair with one of an input pair serving as a first input terminal;
a second differential pair with one of an input pair serving as a second input terminal, the second differential pair connected in parallel with the first differential pair and having a same conductivity type as the first differential pair; and
a first capacity reduction circuit that reduces a capacity of the first differential pair in operation when a first input voltage input to the first input terminal is equal to or greater than an operation threshold of the first differential pair and a second input voltage input to the second input terminal is less than an operation threshold of the second differential pair, wherein
the first capacity reduction circuit suppresses a current of a first constant current source when the first input voltage is equal to or greater than the operation threshold of the first differential pair and the second input voltage is less than the operation threshold of the second differential pair.

2. The differential amplifier according to claim 1, further comprising:
the first constant current source connected in common to sources of a pair of MOS transistors comprising the first differential pair; and
a second constant current source connected in common to sources of a pair of MOS transistors comprising the second differential pair.

3. The differential amplifier according to claim 2, wherein the first capacity reduction circuit comprises a first MOS transistor connected between the first and second constant current sources and a first power supply, and having the same conductivity type as the first differential pair and the second differential pair, and
the first MOS transistor begins to turn off when the second input voltage becomes equal to or less than the operation threshold of the second differential pair.

4. A differential amplifier comprising:
a first differential pair with one of an input pair serving as a first input terminal;
a second differential pair with one of an input pair serving as a second input terminal, the second differential pair connected in parallel with the first differential pair and having a same conductivity type as the first differential pair;
a first capacity reduction circuit that reduces a capacity of the first differential pair in operation when a first input voltage input to the first input terminal is equal to or greater than an operation threshold of the first differential pair and a second input voltage input to the second input terminal is less than an operation threshold of the second differential pair;
a third differential pair with one of an input pair connected to the first input terminal, the third differential pair having a different conductivity type from the first differential pair and the second differential pair;
a fourth differential pair with one of an input pair connected to the second input terminal, the fourth differential pair connected in parallel with the third differential pair and having the same conductivity type as the third differential pair; and
a second capacity reduction circuit that reduces a capacity of the fourth differential pair in operation when the second input voltage is equal to or greater than an operation threshold of the fourth differential pair and the first input voltage is less than an operation threshold of the third differential pair.

5. The differential amplifier according to claim 4, further comprising:
a third constant current source connected in common to sources of a pair of MOS transistors comprising the third differential pair; and
a fourth constant current source connected in common to sources of a pair of MOS transistors comprising the fourth differential pair, wherein
the second capacity reduction circuit suppresses a current of the fourth constant current source when the second input voltage is equal to or greater than the operation threshold of the fourth differential pair and the first input voltage is lower than the operation threshold of the third differential pair.

6. The differential amplifier according to claim 5, wherein the second capacity reduction circuit comprises a second MOS transistor connected between the third and fourth constant current sources and a second power supply and having the same conductivity type as the third differential pair and the fourth differential pair, and
the second MOS transistor begins to turn off when the first input voltage becomes equal to or less than the operation threshold of the third differential pair.

7. A differential amplifier comprising:
a first differential pair with one of an input pair serving as a first input terminal;
a second differential pair with one of an input pair serving as a second input terminal, the second differential pair connected in parallel with the first differential pair and having a same conductivity type as the first differential pair; and a transistor with a source and a drain connected in series between constant current sources of the first and second differential pairs and a power supply that supplies a power in common to the constant current sources of the first and second differential pairs and a gate connected to one of the first input terminal and the second input terminal, the transistor having the same conductivity type as the first differential pair.

8. A source driver for a display device, the source driver comprising the differential amplifier according to claim 1.

9. The differential amplifier according to claim 1, wherein said first differential pair comprises a plurality of differential pairs, and said second differential pair comprises a plurality of differential pairs.

10. The differential amplifier according to claim 2, wherein the first capacity reduction circuit comprises a first MOS transistor connected between the first and second constant current sources and a first power supply.

11. The differential amplifier according to claim 1, further comprising:
- the first constant current source connected in common to sources of a pair of MOS transistors comprising the first differential pair; and
- a second constant current source connected in common to sources of a pair of MOS transistors comprising the second differential pair, wherein
- the first capacity reduction circuit comprises a first MOS transistor connected between the first and second constant current sources and a first power supply.

12. The differential amplifier according to claim 1, further comprising a transistor, said transistor including a source and a drain connected in series between constant current sources of the first and second differential pairs and a power supply that supplies a power in common to the constant current sources of the first and second differential pairs.

* * * * *